United States Patent [19]

Belouet et al.

[11] Patent Number: 5,521,149

[45] Date of Patent: May 28, 1996

[54] HIGH TEMPERATURE SUPERCONDUCTING CURRENT LIMITER

[75] Inventors: Christian Belouet, Sceaux; Thierry Verhaege, Saulx les Chartreux, both of France

[73] Assignee: Alcatel Alsthom Compagnie Generale D'Electricite, Paris Cedex, France

[21] Appl. No.: 451,395

[22] Filed: May 26, 1995

[30] Foreign Application Priority Data

Jun. 6, 1994 [FR] France .................................. 94 06887

[51] Int. Cl.$^6$ ............................. H02H 7/00; H02H 9/00
[52] U.S. Cl. ........................... 505/211; 505/881; 338/20; 338/325; 361/19
[58] Field of Search ....................... 338/20, 325; 361/19; 505/121, 125, 704, 782, 785, 881

[56] References Cited

U.S. PATENT DOCUMENTS

| 5,231,369 | 7/1993 | Preisler et al. ............................. 338/20 |
| 5,235,309 | 8/1993 | Preisler et al. ............................. 338/20 |

FOREIGN PATENT DOCUMENTS

| 0523374A1 | 1/1993 | European Pat. Off. . |
| 0525313A2 | 2/1993 | European Pat. Off. . |
| 2671341 | 7/1992 | France . |

Primary Examiner—Leo P. Picard
Assistant Examiner—Raymond M. Barrera
Attorney, Agent, or Firm—Sughrue, Mion, Zinn, Macpeak & Seas

[57] ABSTRACT

A superconducting current limiter comprising a bar or tube of high temperature superconducting material of the composite type made up of glass and a high temperature superconducting oxide, the volume fraction of the glass lying in the range 10% to 40%, the bar or tube being selected to comply with the following inequalities:

$$\rho > 10^{-4}\ \Omega \cdot m$$

$$j_c > 10^{+5}\ A/m^2$$

$$\rho x^2 < 10^{11}\ W/m^3$$

in which inequalities:

ρ designates the resistivity of the material in the normal, i.e. the non-superconducting, state;

$j_c$ designates the critical current density;

$\rho x^2$ designates the power density dissipated in the bar or tube during the transition stage;

it being specified that the critical current density is defined as the density which produces an electric field of $10^{-4}$ V/m along the tube or bar and that it is accepted that limitation takes place for a current density equal to five times the critical current density.

6 Claims, 1 Drawing Sheet

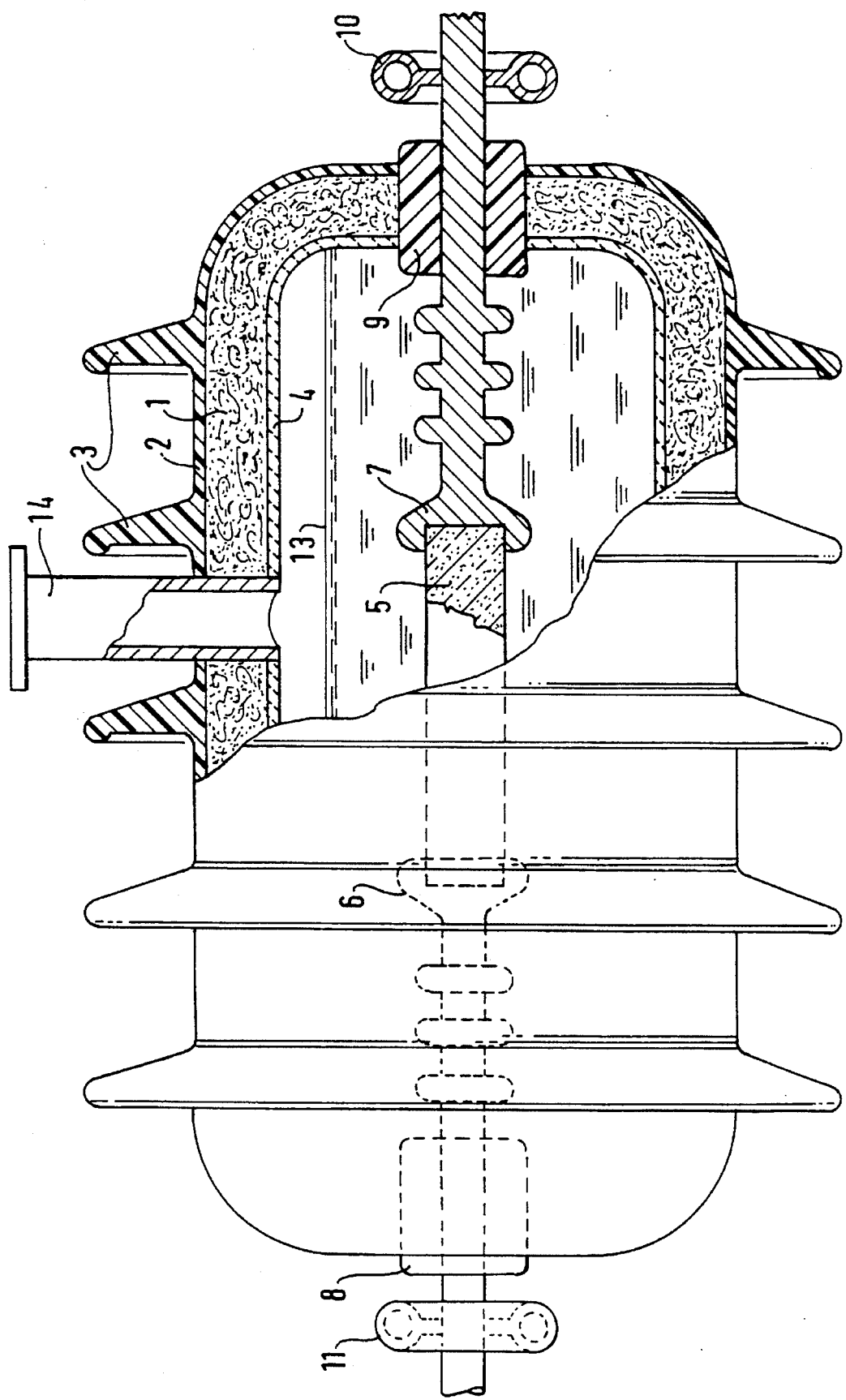

HIGH TEMPERATURE SUPERCONDUCTING CURRENT LIMITER

The present invention relates to a current limiter that makes use of a material having a high critical temperature.

BACKGROUND OF THE INVENTION

The appearance of superconducting materials having high critical temperature, in particular above the temperature of liquid nitrogen, has given rise to hopes of making current limiters that are cheap.

Unfortunately, at present, it is technically possible to fabricate such materials only in the form of solid tubes.

Superconducting limiters have been described that operate inductively, comprising a magnetic circuit having on one branch thereof a winding that carries the current to be limited and whose other branch is surrounded by a coil of superconducting material carrying a direct current. Under normal conditions, the magnetic circuit is saturated by the current carried by the superconducting tube; in the event of a fault, the amplitude of the current in the winding causes the magnetic circuit to desaturate, and inductive voltages in the winding serve to limit the current.

That solution is limited to low powers since at greater powers the volume of the magnetic circuit and of the primary coil become prohibitive.

Proposals have also been made for systems similar to the above, in which the superconducting coil does not carry direct current but forms a closed loop and is equivalent to a transformer having a secondary winding that is short-circuited. It thus carries a current that is proportional to the current in the primary, which current serves to screen the magnetic circuit; when the secondary current reaches the critical current, then the superconductor switches to a resistive state, thereby eliminating the screening and producing a large current-limiting impedance in the primary. That technique does indeed serve to simplify the superconducting coil, reducing it to one or more solid tubes. Nevertheless, as in the preceding technique, it is heavily penalized by the size of the magnetic circuit and of the primary coil that are required.

Limiters are also known that operate resistively, in which the current to be limited is conveyed by a portion of superconducting material whose resistance increases suddenly when the critical density is exceeded, e.g. because of a short-circuit current.

Such limiters exist, but they make use of superconducting materials having a low critical temperature.

It has also been considered that the resistive current limiting technique could be used with a superconducting material having a high critical temperature, e.g. by using a strand of high critical temperature superconducting material having a sheath made of metal, e.g. silver; the sheath of metal is necessary to make it possible to fabricate long lengths of wire. That solution cannot be used at high powers because the metal sheath compromises the current-limiting effect.

OBJECTS AND SUMMARY OF THE INVENTION

An object of the invention is to provide a current limiter that operates resistively and that makes use of a high critical temperature superconducting material, made in the form of a bar or tube of meter-sized length.

The invention provides a superconducting current limiter comprising a bar or tube of high temperature superconducting material of the composite type made up of glass and a high temperature superconducting oxide, the volume fraction of the glass lying in the range 10% to 40%, the bar or tube being selected to comply with the following inequalities:

$$\rho > 10^{-4} \; \Omega \cdot m$$

$$j_c > 10^{+5} \; A/m^2$$

$$\rho \times (5j_c)^2 < 10^{11} \; W/m^3$$

in which inequalities:

$\rho$ designates the resistivity of the material in the normal, i.e. the non-superconducting, state;

$j_c$ designates the critical current density;

$\rho \times (5j_c)^2$ designates the power density dissipated in the bar or tube during the transition stage;

it being specified that the critical density is defined as the density which produces an electric field of $10^{-4}$ V/m along the tube or bar and that it is accepted that limitation takes place for a current density equal to five times the critical density.

Preferably, the superconducting oxide is of the $Bi_2Sr_2Ca_2Cu_3O_y$ type where y is about 10.

In a particular embodiment, the current limiter comprises a cylindrical insulating case, with the bar or tube being disposed axially inside the case which is itself partially filled with liquid nitrogen.

BRIEF DESCRIPTION OF THE DRAWING

The invention will be well understood on reading the following description of an embodiment of the invention, given with reference to the accompanying drawing, in which:

the sole FIGURE is an axial section through a high critical temperature superconducting current limiter implemented in application of the invention.

MORE DETAILED DESCRIPTION

One of the merits of the inventors is to have realized that, in the present state of the art, in order to make a high critical temperature superconducting current limiter, it is necessary to use a material whose superconducting properties have the reputation of being mediocre.

Such a superconducting material is described in French patent application No. 91 00072 filed on Jan. 4, 1991.

That material is made of glass and of a high critical temperature superconducting material oxide such as $Bi_2Sr_2Ca_2Cu_3O_y$ (where y is about 10), the glass being such that its vitreous transition temperature is less than 750K, the volume fraction of glass lying in the range 10% to 40%, and said oxide being in the glass in the form of crystallites having substantially the same orientation.

This material has superconducting properties that are described as mediocre for the following reasons:

its critical current density $j_c$ is low at the reference field value of $10^{-4}$ V/m, being about $10^{+5}$ A/m$^2$ to $10^{+6}$ A/m$^2$;

its resistivity in the normal state is much greater than that of other superconductors; and the bend in the curve of electric field as a function of current density as observed at the critical value of current density is not well marked.

Nevertheless, such a material can be used to make a current limiter, as shown below in an example.

The example applies to a current limiter designed to limit fault current on a line having a nominal voltage $V_n=63$ kV and a nominal current $I_n=1.25$ kA, i.e. a power of 45 MVA.

The object of the invention is to have a limiter in the form of a bar or a tube that is of meter-sized length, with the power dissipated per unit volume being reasonable during the transition stage, e.g. less than $10^{11}$ W/m$^3$, assuming that in the event of a fault current, the current density reaches five times the value of the critical current density.

According to the invention, the material is selected so that:

the resistivity $\rho$ of the superconducting material in the normal state is greater than $10^{-4}$ $\Omega \cdot$m, and typically $10^{-3}$;

the critical current density $j_c$ is greater than or equal to $5 \times 10^5$ A/m$^2$; and the power density P dissipated in the bar or tube during the transition stage is less than $10^{11}$ W/m$^3$.

By way of example, with $\rho=5\times10^{-3}$ $\Omega \cdot$m and with $j_c=10^6$ A/m$^2$, that gives:

$$V_n = \rho \times j_n \times l$$

where:

l is the length of the bar;

$V_n$ is the nominal voltage, i.e. 36,000 V;

$\rho$ is the resistivity under current-limiting conditions; and $j_n$ is current density in the normal state, i.e. $j_n = 5 \times j_c = 5 \times 10^6$;

whence:

$l = 36,000/(10^{-3} \times 5 \times 10^6) = 7.2$ meters

The section s of the superconducting bar is then equal to $I_n/j_c$, i.e. $1250/10^6 = 0.00125$ m$^2 = 12.5$ cm$^2$.

The volume v of the bar is equal to:

7.2 m$\times$0.00125 m$^2$=0.009 m$^3$, i.e. 9 liters.

Resistive losses $p_f$ under normal operating conditions are about: p1 $p_f$=E$\times$j$\times$v=$10^{-4}\times10^6\times9\times10^{-3}$=9 watts, which is entirely acceptable when compared with the power being conveyed, which is 45 MVA.

The power density P dissipated in the bar during a current-limiting operation is equal to:

P=$\rho\times(5j_c)^2=10^{-3}\times(5\times10^6)^2=2.5\times10^{10}$ W/m$^3$

FIG. 1 is a diagram showing how a superconductive current limiter can be implemented in accordance with the invention. It comprises a cylindrical case of material that is insulating both thermally and electrically, e.g. comprising polyurethane foam 1 covered in a layer of elastomer 2 having fins 3; stiffness may be obtained by a ceramic inner layer 4.

The bar 5 of high critical temperature superconducting material is placed on the axis of the enclosure and is held by two copper arms 6 and 7 connected in series in the protected line.

The feedthroughs for the arms 6 and 7 are sealed by gaskets 8 and 9 made of epoxy resin that has been filled with glass beads, for example, in order to avoid cracking.

Two anti-corona rings 10 and 11 serve to spread potential in the vicinity of the feedthroughs.

The bar is cooled by a bath of liquid nitrogen 13 which is delivered via a pipe 14 leading into the top of the case.

As mentioned above, the material of the bar is a composite based on superconducting oxide, and is made up of glass and said oxide, with the volume fraction of the glass lying in the range 10% to 40%.

The glass is advantageously a glass comprising an oxide selected from PbO, $B_2O_3$, $Bi_2O_3$, CaO, $SiO_2$, and the vitrified oxide that corresponds to the formulation of the superconductor.

The said superconducting oxide is preferably of the $Bi_2Sr_2Ca_2Cu_3O_y$ type where y is about 10.

In a variant, any of the compositions specified in the above-specified patent may be used.

What is claimed is:

1. A superconducting current limiter comprising:

an enclosure;

a pair of copper arms each extending respectively through a respective opening in opposed ends of the enclosure;

a bar or tube extending between and held by said copper arms in said enclosure, said bar or tube being made of high temperature superconducting material of the composite type made up of glass and a high temperature superconducting oxide, the volume fraction of the glass lying in the range 10% to 40%, the bar or tube being selected to comply with the following inequalities:

$\rho > 10^{-4}$ $\Omega \cdot$m $j_c > 10^{+5}$ A/m$^2$ $\rho x^2 < 10^{11}$ W/m$^3$ in which inequalities:

$\rho$ designates the resistivity of the material in the normal, i.e. the non-superconducting, state;

$j_c$ designates the critical current density;

$\rho x^2$ designates the power density dissipated in the bar or tube during the transition stage;

it being specified that the critical current density is defined as the density which produces an electric field of $10^{-4}$ V/m along the tube or bar and that it is accepted that limitation takes place for a current density equal to five times the critical current density;

said current limiter further comprising cooling means for cooling said bar or tube.

2. A superconducting current limiter according to claim 1, wherein the superconducting oxide is of the $Bi_2Sr_2Ca_2Cu_3O_y$ type where y is about 10.

3. A superconducting current limiter according to claim 1, wherein said enclosure comprises polyurethane foam covered in a layer of elastomer, a plurality of elastomer first being formed as part of said layer of elastomer.

4. A superconducting current limiter according to claim 3, further comprising a pair of anti-corona rings each disposed around a respective one of said pair of copper arms, for spreading potential in a vicinity of each said opening.

5. A superconducting current limiter according to claim 1, wherein said cooling means comprises a bath of liquid nitrogen within said enclosure and a pipe for delivering said liquid nitrogen to said enclosure.

6. A superconducting current limited according to claim 3, wherein said enclosure further comprises a ceramic layer inside said polyurethane foam.

* * * * *